(12) United States Patent
Tounai

(10) Patent No.: US 7,974,457 B2
(45) Date of Patent: Jul. 5, 2011

(54) METHOD AND PROGRAM FOR CORRECTING AND TESTING MASK PATTERN FOR OPTICAL PROXIMITY EFFECT

(75) Inventor: Keiichiro Tounai, Kawasaki (JP)

(73) Assignee: Renesas Electronics Corporation (JP)

( * ) Notice: Subject to any disclaimer, the term of this patent is extended or adjusted under 35 U.S.C. 154(b) by 1586 days.

(21) Appl. No.: 10/813,834

(22) Filed: Mar. 31, 2004

(65) Prior Publication Data

US 2004/0191648 A1 Sep. 30, 2004

(30) Foreign Application Priority Data

Mar. 31, 2003 (JP) .................................. 2003-94710

(51) Int. Cl.
*G06K 9/00* (2006.01)
(52) U.S. Cl. ......................... 382/144; 382/145; 382/181
(58) Field of Classification Search .................. 382/144, 382/181, 141, 152; 716/4; 438/16; 348/86, 348/87, 92
See application file for complete search history.

(56) References Cited

U.S. PATENT DOCUMENTS

| | | | | |
|---|---|---|---|---|
| 5,705,301 A | * | 1/1998 | Garza et al. ...................... | 430/5 |
| 5,991,006 A | * | 11/1999 | Tsudaka ........................... | 355/53 |
| 6,174,633 B1 | * | 1/2001 | Tounai ............................. | 430/30 |
| 6,316,163 B1 | * | 11/2001 | Magoshi et al. ................. | 430/296 |
| 6,350,977 B2 | * | 2/2002 | Taoka ............................. | 250/204 |
| 6,453,274 B2 | * | 9/2002 | Kamon ............................ | 703/2 |
| 6,665,858 B2 | * | 12/2003 | Miyazaki ......................... | 430/319 |
| 6,907,596 B2 | * | 6/2005 | Kobayashi et al. .............. | 716/19 |
| 2002/0043615 A1 | * | 4/2002 | Tounai et al. .................... | 250/221 |

FOREIGN PATENT DOCUMENTS

| | | |
|---|---|---|
| JP | 11-096200 | 9/1999 |
| JP | 11-338904 | 10/1999 |
| JP | 2000-214577 | 4/2000 |
| JP | 2000-214577 | 8/2000 |
| JP | 2000-294650 | 10/2000 |
| JP | 2002-244275 | 8/2002 |

OTHER PUBLICATIONS

Japanese Official Action and Translation (6 pgs) Date: (Jan. 2003).

* cited by examiner

*Primary Examiner* — Brian Q Le
*Assistant Examiner* — Edward Park
(74) *Attorney, Agent, or Firm* — Hayes Soloway P.C.

(57) ABSTRACT

A method of testing a mask pattern, includes applying optical proximity-effect compensation to a first pattern to be tested and to be formed onto a mask layer, to thereby form a mask pattern of the mask layer, dividing the first pattern into a plurality of areas in accordance with a second pattern to be formed onto another mask layer, determining sampling points on an edge of the first pattern, determining a test standard for each of the areas, simulating a resist pattern formed on a resist by exposing the resist to a light through the mask pattern, and checking whether a dimensional gap between the first pattern and the resist pattern at each of the sampling points is within a test standard associated with an area to which each of the sampling points belongs, wherein test standards for first and second areas among the areas are different from each other.

28 Claims, 6 Drawing Sheets

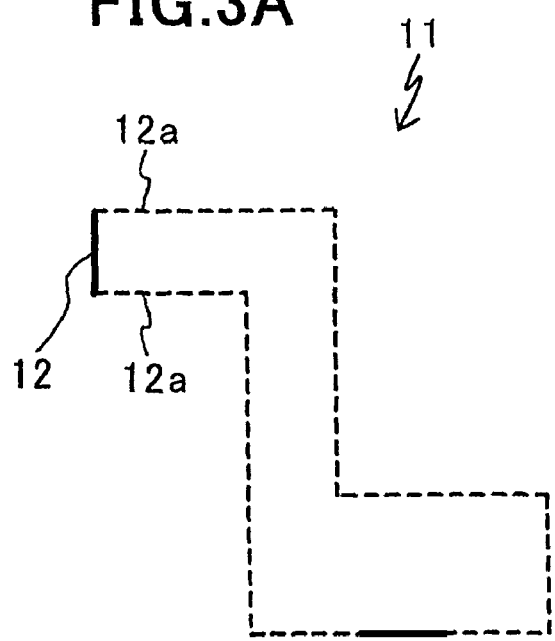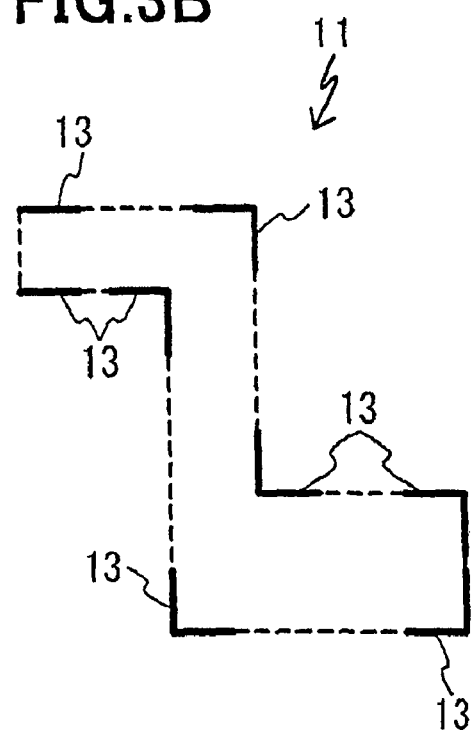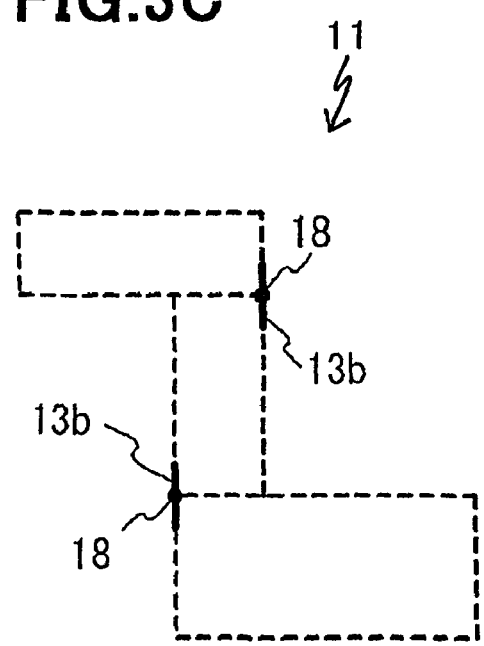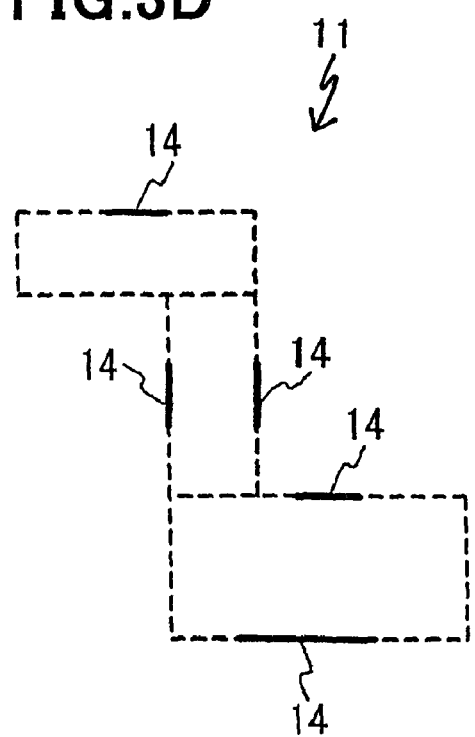

METHOD AND PROGRAM FOR CORRECTING AND TESTING MASK PATTERN FOR OPTICAL PROXIMITY EFFECT

BACKGROUND OF THE INVENTION

1. Field of the Invention

The invention relates to a method of testing a mask pattern, and more particularly to a method of testing whether a mask pattern to which optical proximity-effect compensation is applied can be a base to form a desired resist pattern. The invention relates further to a program for causing a computer to carry out the above-mentioned method.

2. Description of the Related Art

Recent reduction in a design-rule of a semiconductor device causes a problem of optical proximity effect. Herein, optical proximity effect is defined as phenomenon in which a pattern different in shape from a mask pattern formed in a mask is formed on a resist. For instance, when a resist is exposed to a light through a mask having an L-shaped pattern, corners of an L-shaped pattern formed in a resist are rounded due to optical proximity effect. In addition, a width of a line pattern formed on a resist is dependent on an interval between line patterns due to optical proximity effect. For instance, a line pattern among line patterns formed in a high density and a line pattern solitarily formed would have widths different from each other on a resist, even if they had a common width on a mask.

In order to compensate for optical proximity effect, optical proximity-effect compensation is carried out during a fabrication process of a mask pattern. That is, a desired resist pattern is modified, taking optical interference into consideration, to thereby form a mask pattern. A desired resist pattern is transferred to a resist through a mask having the thus formed mask pattern. The thus formed mask pattern is different in shape from a desired resist pattern.

The optical proximity-effect compensation ensures a desired resist pattern, but causes necessity of testing a mask pattern by virtue of computer simulation. A shape of a resist pattern transferred from a mask having a certain mask pattern is dependent on interference of a light passing through the mask pattern. Definition of a resist pattern with such interference being taken into consideration cannot be accomplished without computer simulation. Hence, whether it is possible to form a desired resist pattern, based on a mask having a certain mask pattern, is tested by computer simulation.

In testing a mask pattern, it is important to be able to surely detect a non-desired resist pattern. For instance, Japanese Patent Application Publication No. 2000-214577 has suggested a method of detecting deformation of a pattern located remote from an edge of a pattern, in other words, detecting a resist pattern at a location where a resist pattern should not be formed, if a resist pattern is formed accurately in accordance with a designed pattern. The suggested method includes the steps of determining sampling points in a predetermined area other than an edge of a designed pattern, and comparing a dimension of a designed pattern with a dimension of a resist pattern calculated by simulation, at each of the sampling points. The suggested method makes it possible to detect deformation of a pattern in an area remote from an edge of a designed pattern, by selectively determining sampling points in a predetermined area other than an edge of a designed pattern.

It is preferable in a test of a mask pattern to determine a test standard, taking into consideration a structure of a semiconductor integrated circuit as a final product. Herein, a test standard is a standard in accordance with which a mask pattern is judged as to whether it is accurately formed. A decision as to whether a mask pattern is accurate is dependent on whether a resist pattern by which a semiconductor integrated circuit as a final product can properly operate is formed. Accordingly, a test standard is determined so as to make it possible to form a resist pattern by a semiconductor integrated circuit as a final product can properly operate.

When severe restriction is applied to a dimension of a resist pattern for properly operating a semiconductor integrated circuit, a test standard used for testing a mask pattern has to be determined accordingly. For instance, a width of a gate line in a MOS transistor much exerts an influence on characteristics of a MOS transistor. Accordingly, a width of a gate line has to be accurately controlled, and hence, a test standard used for testing a width of a resist pattern used as a mask through which a gate line is etched has to be determined accordingly. Furthermore, when a contact or a via-hole is designed to make contact with a wiring layer, the wiring layer has to be accurately positioned in order to ensure for the contact to make contact with the wiring layer, and hence, a position of a resist pattern used as a mask through which a wiring layer is etched has to be determined accordingly.

To the contrary, when a resist pattern has a broad dimensional margin in which a semiconductor integrated circuit can properly operate, it is not necessary to determine a severe test standard. This is because a severe test standard causes an increase in repair of a mask pattern with the result of an increase in a turn-around time (TAT) for fabricating a mask.

In addition, it is necessary to select sampling points at appropriate locations in testing a mask pattern, taking a structure of a semiconductor integrated circuit as a final product into consideration. In order to thoroughly test a mask pattern for surely detecting a non-desired resist pattern, it is effective to test a mask pattern with a lot of sampling points. However, a lot of sampling points would increase calculation necessary for carrying out simulation, resulting in that simulation takes much time. Accordingly, it is preferable that sampling points are selected only at appropriate locations, and a mask pattern is tested with a small number of sampling points.

As mentioned earlier, a semiconductor integrated circuit has portions in which a dimension of a pattern has to be accurately controlled, and portions in which it is not always necessary to accurately control a dimension of a pattern. Hence, it is preferable that a lot of sampling points are selected for the former portions, and a small number of sampling points are selected for the latter portions for making it possible to accurately test a mask pattern with a minimum number of sampling points.

Japanese Patent Application Publication No. 11-338904 has suggested a method of testing an error against a design rule, including the steps of arranging two cells adjacent to each other, removing patterns in the two cells which patterns are located at a first distance or more from tangential lines of the two cells, and detecting an error against a design rule in the rest of patterns of the two cells.

Japanese Patent Application Publication No. 11-96200 has suggested a semiconductor designer for detecting violation of a design rule in a mask layout pattern of a semiconductor integrated circuit, including means for inputting thereinto a layout-testing rule file in which layout data and layout design rule are written, means for recognizing a pattern to be tested in the layout data, means for calculating coordinates of a center of the thus recognized pattern, means for measuring a distance from the center to a predetermined point, means for comparing the thus measured distance to a reference distance written in the layout-testing rule file, and means for outputting an error when the distance does not meet with the reference distance.

Japanese Patent Application Publication No. 2000-294650 has suggested a method of testing a latch-up of layout data, including the steps of picking out a well region, a transistor region and a substrate contact region out of layout data of a semiconductor integrated circuit formed on a semiconductor substrate, and determining an over-size for each of the regions.

SUMMARY OF THE INVENTION

In view of the above-mentioned problems in the prior art, it is an object of the present invention to provide a method of testing a mask pattern, based on a test standard determined in accordance with a structure of a semiconductor integrated circuit as a final product.

It is another object of the present invention to provide a method of testing a mask pattern, in which a minimum number of sampling points used for testing a mask pattern are selected in accordance with a structure of a semiconductor integrated circuit as a final product, ensuring that a mask pattern is accurately tested.

It is still another object of the present invention to provide a computer program capable of doing the same as the above-mentioned method.

Hereinbelow is described a method of testing a mask pattern in accordance with the present invention through the use of reference numerals used in later described embodiments. The reference numerals are indicated only for the purpose of clearly showing correspondence between claims and the embodiments. It should be noted that the reference numerals are not allowed to use in the interpretation of claims of the present application.

In one aspect of the present invention, there is provided a method of testing a mask pattern, including (a) applying optical proximity-effect compensation to a first pattern (11) to be tested and to be formed onto a mask layer, to thereby actually form a mask pattern of the mask layer, (b) dividing the first pattern (11) into a plurality of areas (21, 22, 23) in accordance with a second pattern to be formed onto another mask layer, (c) determining sampling points (15X, 16AX, 16BX, 17X, 17Y) on an edge of the first pattern (11), (d) determining a test standard for each of the areas (21, 22, 23), (e) simulating a resist pattern formed on a resist by exposing the resist to a light through the mask pattern, and (f) checking whether a dimensional gap between the first pattern (11) and the resist pattern at each of the sampling points (15X, 16AX, 16BX, 17X, 17Y) is within a test standard associated with an area to which each of the sampling points (15X, 16AX, 16BX, 17X, 17Y) belongs, wherein a test standard for a first area (21, 22) among the areas (21, 22, 23) and a test standard for a second area (23) among the areas (21, 22, 23) are different from each other.

In accordance with the above-mentioned method, a first pattern to be tested is divided into a plurality of areas through the use of a pattern of another mask structurally relating to a mask to be tested, and a test standard is determined for each of the areas. Thus, it is possible to test a mask pattern with an appropriate test standard determined in accordance with a structure of a semiconductor integrated circuit as a final product.

It is preferable that a sampling point located in a N-th area, among the sampling points (15X, 16AX, 16BX, 17X, 17Y), is determined in accordance with a N-th process in the step (c) wherein N indicates an integer equal to or greater than one (N=1, 2, 3, 4, - - - ), and first to N-th processes are different from one another.

The method may further include dividing an edge of the first pattern (11) into a plurality of portions (12, 13, 13b 14), wherein the test standard is determined for each of the portions (12, 13, 13b 14).

It is preferable that the first pattern (11) is a pattern for forming a wiring layer, the second pattern is a pattern for forming a contact reaching the wiring layer, and the first area (21, 22) includes a third area (21) including a contact area in which the contact makes contact with the wiring layer.

It is preferable that the third area (21) is comprised of the contact area (21a) and an ambient area (21b) surrounding the contact area (21a).

It is preferable that the first pattern (11) is a pattern for forming a wiring layer including a gate of a MOS transistor, the second pattern is a pattern for forming an active area of the MOS transistor, and the first area (21, 22) includes a fourth area (22) including a fifth area obtained by projecting the active area onto the first pattern (11).

It is preferable that the fourth area (22) is comprised of the fifth area (22a) and an ambient area (22b) surrounding the fifth area (22a).

In another aspect of the present invention, there is provided a program for causing a computer to carry out a method of testing a mask pattern, steps executed by the computer in accordance with the program including (a) applying optical proximity-effect compensation to a first pattern (11) to be tested and to be formed onto a mask layer, to thereby actually form a mask pattern of the mask layer, (b) dividing the first pattern (11) into a plurality of areas (21, 22, 23) in accordance with a second pattern to be formed onto another mask layer, (c) determining sampling points (15X, 16AX, 16BX, 17X, 17Y) on an edge of the first pattern (11), (d) determining a test standard for each of the areas (21, 22, 23), (e) simulating a resist pattern formed on a resist by exposing the resist to a light through the mask pattern, and (f) checking whether a dimensional gap between the first pattern (11) and the resist pattern at each of the sampling points (15X, 16AX, 16BX, 17X, 17Y) is within a test standard associated with an area to which each of the sampling points (15X, 16AX, 16BX, 17X, 17Y) belongs, wherein a test standard for a first area (21, 22) among the areas (21, 22, 23) and a test standard for a second area (23) among the areas (21, 22, 23) are different from each other.

In the above-mentioned program, a sampling point located in a N-th area, among the sampling points (15X, 16AX, 16BX, 17X, 17Y), may be determined in accordance with a N-th process in the step (c) wherein N indicates an integer equal to or greater than one (N=1, 2, 3, 4, - - - ), and first to N-th processes are different from one another.

In the above-mentioned program, it is preferable that the steps further include dividing an edge of the first pattern (11) into a plurality of portions (12, 13, 13b, 14), wherein the test standard is determined for each of the portions (12, 13, 13b, 14).

In the above-mentioned program, it is preferable that the first pattern (11) is a pattern for forming a wiring layer, the second pattern is a pattern for forming a contact reaching the wiring layer, and the first area (21, 22) includes a third area (21) including a contact area in which the contact makes contact with the wiring layer.

In the above-mentioned program, it is preferable that the third area (21) is comprised of the contact area (21a) and an ambient area (21b) surrounding the contact area (21a).

In the above-mentioned program, it is preferable that the first pattern (11) is a pattern for forming a wiring layer including a gate of a MOS transistor, the second pattern is a pattern for forming an active area of the MOS transistor, and the first area (21, 22) includes a fourth area (22) including a fifth area obtained by projecting the active area onto the first pattern (11).

In the above-mentioned program, it is preferable that the fourth area (22) is comprised of the fifth area (22a) and an ambient area (22b) surrounding the fifth area (22a).

In still another aspect of the present invention, there is provided a method of forming a mask having a desired mask pattern, including (a) applying optical proximity-effect compensation to a first pattern (11) to be tested and to be formed onto a mask layer, to thereby actually form a mask pattern of the mask layer, (b) dividing the first pattern (11) into a plurality of areas (21, 22, 23) in accordance with a second pattern to be formed onto another mask layer, (c) determining sampling points (15X, 16AX, 16BX, 17X, 17Y) on an edge of the first pattern (11), (d) determining a test standard for each of the areas (21, 22, 23), (e) simulating a resist pattern formed on a resist by exposing the resist to a light through the mask pattern, (f) checking whether a dimensional gap between the first pattern (11) and the resist pattern at each of the sampling points (15X, 16AX, 16BX, 17X, 17Y) is within a test standard associated with an area to which each of the sampling points (15X, 16AX, 16BX, 17X, 17Y) belongs, and (g) transferring the mask pattern onto a mask, wherein a test standard for a first area (21, 22) among the areas (21, 22, 23) and a test standard for a second area (23) among the areas (21, 22, 23) are different from each other.

In the above-mentioned method, it is preferable that a sampling point located in a N-th area, among the sampling points (15X, 16AX, 16BX, 17X, 17Y), is determined in accordance with a N-th process in the step (c) wherein N indicates an integer equal to or greater than one (N=1, 2, 3, 4, - - - ), and first to N-th processes are different from one another.

The method may further include dividing an edge of the first pattern (11) into a plurality of portions (12, 13, 13b, 14), wherein the test standard is determined for each of the portions (12, 13, 13b, 14).

In the above-mentioned method, it is preferable that the first pattern (11) is a pattern for forming a wiring layer, the second pattern is a pattern for forming a contact reaching the wiring layer, and the first area (21, 22) includes a third area (21) including a contact area in which the contact makes contact with the wiring layer.

In the above-mentioned method, it is preferable that the third area (21) is comprised of the contact area (21a) and an ambient area (21b) surrounding the contact area (21a).

In the above-mentioned method, it is preferable that the first pattern (11) is a pattern for forming a wiring layer including a gate of a MOS transistor, the second pattern is a pattern for forming an active area of the MOS transistor, and the first area (21, 22) includes a fourth area (22) including a fifth area obtained by projecting the active area onto the first pattern (11).

The advantages obtained by the aforementioned present invention will be described hereinbelow.

In accordance with the present invention, a designed pattern to be tested is divided into a plurality of areas, and a test standard used for testing a mask pattern is determined for each of the areas. Hence, a mask pattern is tested through the use a test standard appropriately determined in accordance with a structure of a semiconductor integrated circuit as a final product.

In addition, sampling points are selected in each of the areas in accordance with different processes from one another in association with the areas. Hence, sampling points are selected at appropriate locations in accordance with a structure of a semiconductor integrated circuit as a final product, and it is ensured that a mask pattern is accurately tested with a minimum number of sampling points.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 3A is a plan view of an end portion of a designed pattern.

FIG. 3B is a plan view of a corner portion of a designed pattern.

FIG. 3C is a plan view of a side portion of a designed pattern.

FIG. 3D is a plan view of a remainder portion of a designed pattern.

DESCRIPTION OF THE PREFERRED EMBODIMENTS

Preferred embodiments in accordance with the present invention will be explained hereinbelow with reference to drawings.

Figure 1:
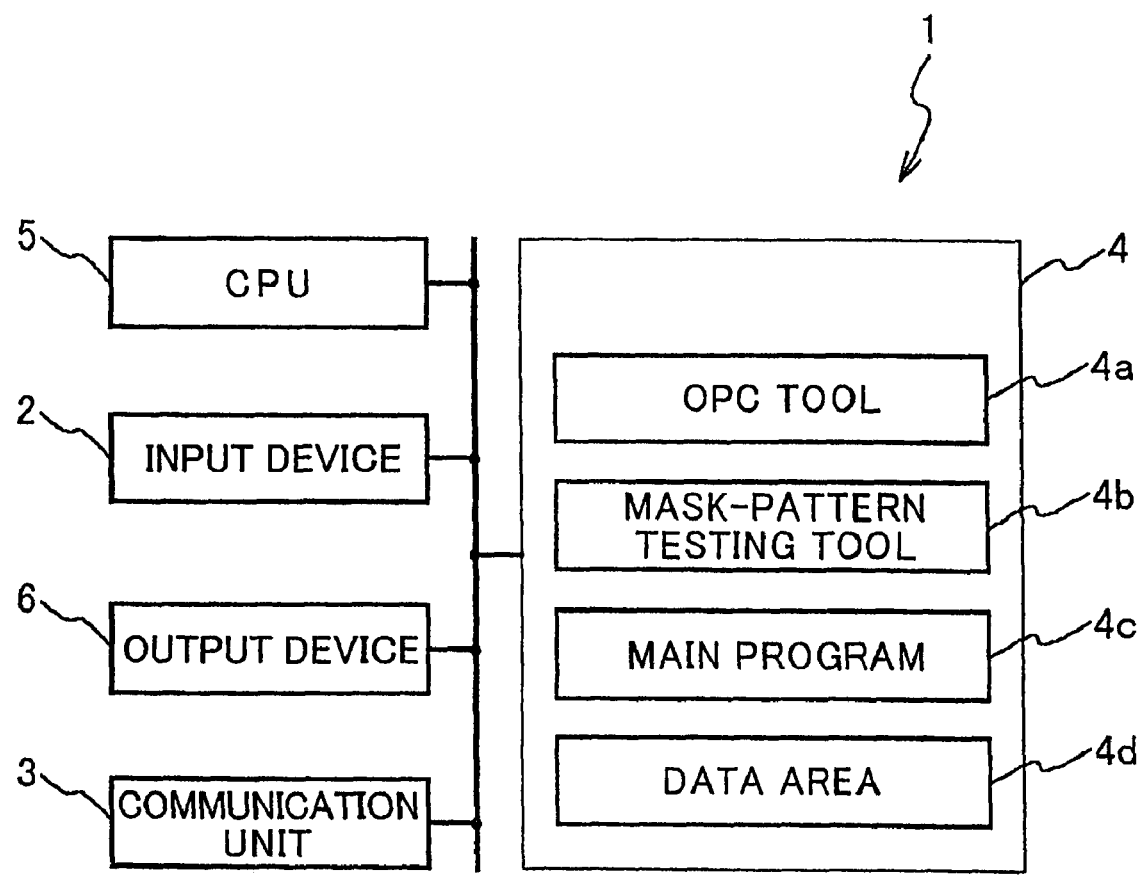
FIG. 1 is a block diagram of a computer system in which a method of testing a mask pattern in accordance with the present invention is put into practice.

FIG. 1 is a block diagram of a computer system 1 which puts a method of testing a mask pattern in accordance with the present invention into practice.

The computer system 1 is comprised of an input device 2, a communication unit 3, a memory 4, a central processing unit 5, and an output device 6.

The input device 2 acts as a man-machine interface between a user and the computer system 1. For instance, the input device 2 is comprised of a keyboard or a mouse.

The communication unit 3 receives a pattern (herein, referred to as "designed pattern") designed by means of a computer-aided design (CAD) from an external unit (not illustrated) through a network (not illustrated). The designed pattern is defined as a target pattern of a resist pattern to be formed on a resist.

The memory 4 stores therein a program and data both necessary for carrying out a method of testing a mask pattern in accordance with an embodiment of the present invention.

Specifically, the memory 4 sores therein an OPC tool 4a, a tool 4b for testing a mask pattern, and a main program 4c.

Herein, the OPC tool 4a is a program used for applying optical proximity-effect compensation (OPC) to the designed pattern to thereby fabricate a mask pattern to be transferred onto a mask.

The mask-pattern testing tool 4b is a program used for testing whether a desired resist pattern is formed onto a resist when the resist is exposed to a light through the mask having the thus fabricated mask pattern. The mask-pattern testing tool 4b carries out lithography simulation to a mask pattern of a mask layer to be tested, to thereby simulate a resist pattern to be transferred onto a resist. Furthermore, the mask-pattern testing tool 4b judges whether a dimensional gap between the designed pattern having been received through the communication unit 3 and a resist pattern having been calculated by simulation is within a test standard.

In the specification, a dimension of a pattern means an interval between the pattern and patterns located adjacent thereto, a width of the pattern, and a location of the pattern.

Figure 2:
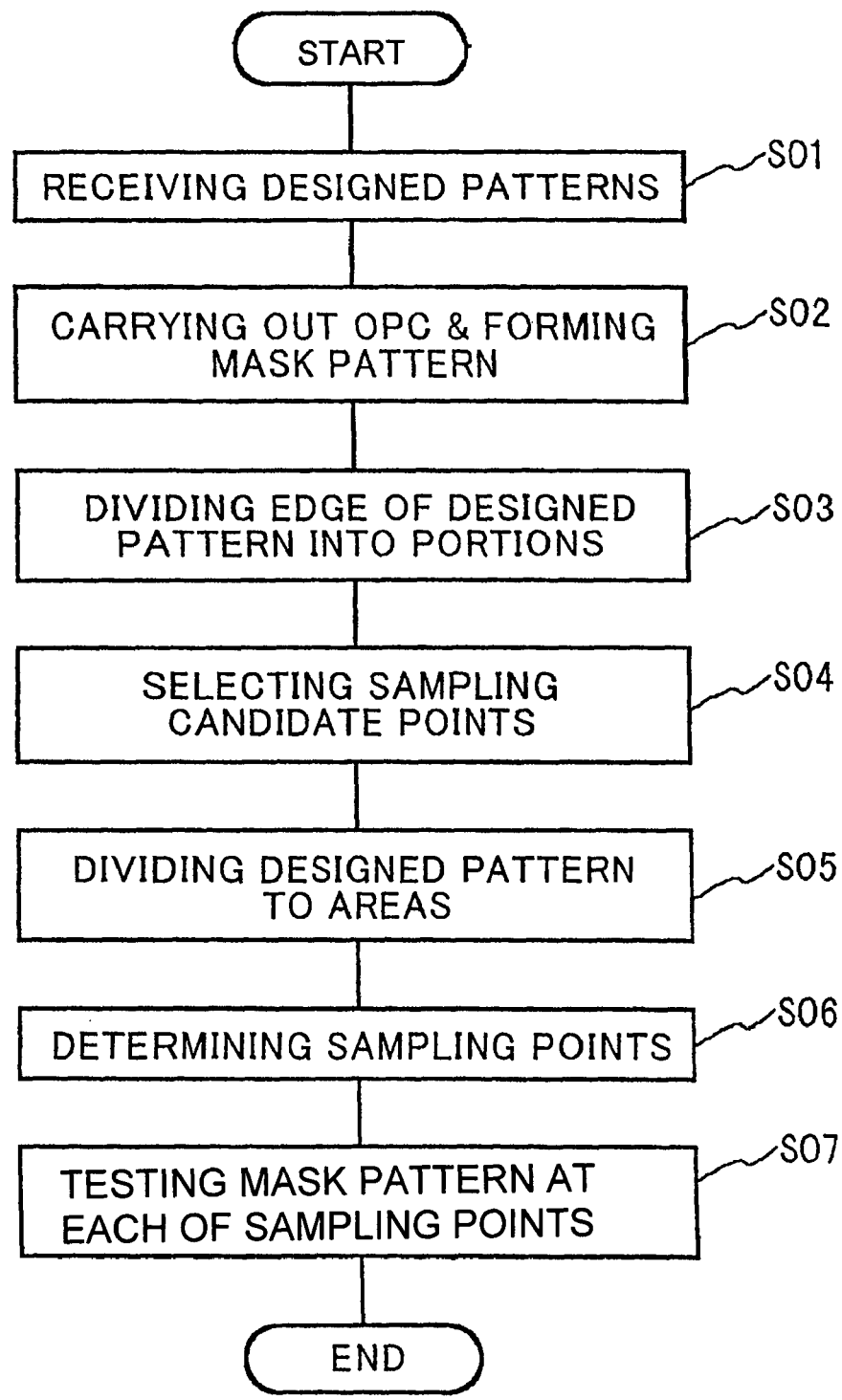
FIG. 2 is a flow-chart showing steps to be carried out in a method of testing a mask pattern in accordance with the present invention.

In the main program 4c are written steps for carrying out a method of testing a mask pattern in accordance with the present embodiment. Specifically, the steps shown in FIG. 2 are written in the main program 4c.

The memory 4 further includes a data area 4d to store therein data necessary for carrying out a method of testing a mask pattern in accordance with the present embodiment. For instance, the data area 4d stores a designed pattern received through the communication unit 3, a mask pattern fabricated by the OPC tool 4a, and a resist pattern fabricated by simulation.

The central processing unit (CPU) 5 executes the OPC tool 4a, the mask-pattern testing tool 4b and the main program 4c to carry out steps necessary for testing a mask pattern.

The output device 6 is comprised of a display such as a cathode ray tube (CRT) or a liquid crystal display (LCD), and a printer, for instance. The output device 6 displays results of testing a mask pattern, and prints out the results.

FIG. 2 is a flow-chart showing steps to be carried out in a method of testing a mask pattern in accordance with the present embodiment.

In the present embodiment, a mask pattern to be transferred to a mask used for forming a gate wiring layer of a MOS transistor is tested.

First, the computer system 1 receives a pattern designed by means of a computer-aided design (CAD) from an external unit (not illustrated) through the communication unit 3, in step S01. In step S01, the computer system 1 receives not only the designed pattern, but also a designed pattern of a mask structurally concerning the mask to be tested. Specifically, since a gate wiring layer is to be tested in the present embodiment, the computer system 1 receives not only a designed pattern of a gate wiring layer, but also designed patterns of a field layer for defining an active region, and a contact layer for forming a contact reaching a wiring in the gate wiring layer. As mentioned later, designed patterns of masks structurally relating to the mask to be tested are used for dividing a designed pattern of the mask into a plurality of areas.

Then, optical proximity-effect compensation (OPC) is applied to the designed pattern of a mask to be tested, to thereby form a mask pattern, in step S02. The optical proximity-effect compensation (OPC) is carried out by the OPC tool 4a. In the subsequent steps, the mask pattern formed in step S02 is tested. If it is judged that a desired resist pattern can be formed based on the mask pattern tested, the mask pattern is transferred to a mask.

Then, an edge of the designed pattern of a mask to be tested is divided into a plurality of portions, in step S03. Specifically, an edge of the designed pattern of a mask to be tested is divided into four portions, that is, end portions 12 (see FIG. 3A), corner portions 13 (see FIG. 3B), side portions 13b (see FIG. 3C) located within a predetermined distance from the corners, and a remainder portion 14 (see FIG. 3D).

As illustrated in FIG. 3A, the end portion 12 is defined as a portion of a line extending in a direction which portion is defined by two lines 12a extending perpendicularly to the direction. The end portion 12 has a width smaller than a predetermined width.

As illustrated in FIG. 3B, the corner portion 13 is defined as a portion extending from corners in a rectangular area constituting a designed pattern 11, having a length equal to or smaller than a predetermined length L (see FIG. 4), and not overlapping the end portion 12.

As illustrated in FIG. 3C, the side portion 13b is defined as a portion extending from a base point 18, having a length equal to or smaller than the predetermined length L, and not overlapping the end portion 12. Herein, the base point 18 is defined as an intersection of an edge of the designed pattern 11 with lines vertically and horizontally extending from the corners of the designed pattern 11 and having a predetermined length.

As illustrated in FIG. 3D, the remainder portion 14 is defined as a portion except the end portions 12, the corner portions 13, and the side portions 13b in an edge of the designed pattern 11.

Figure 4:
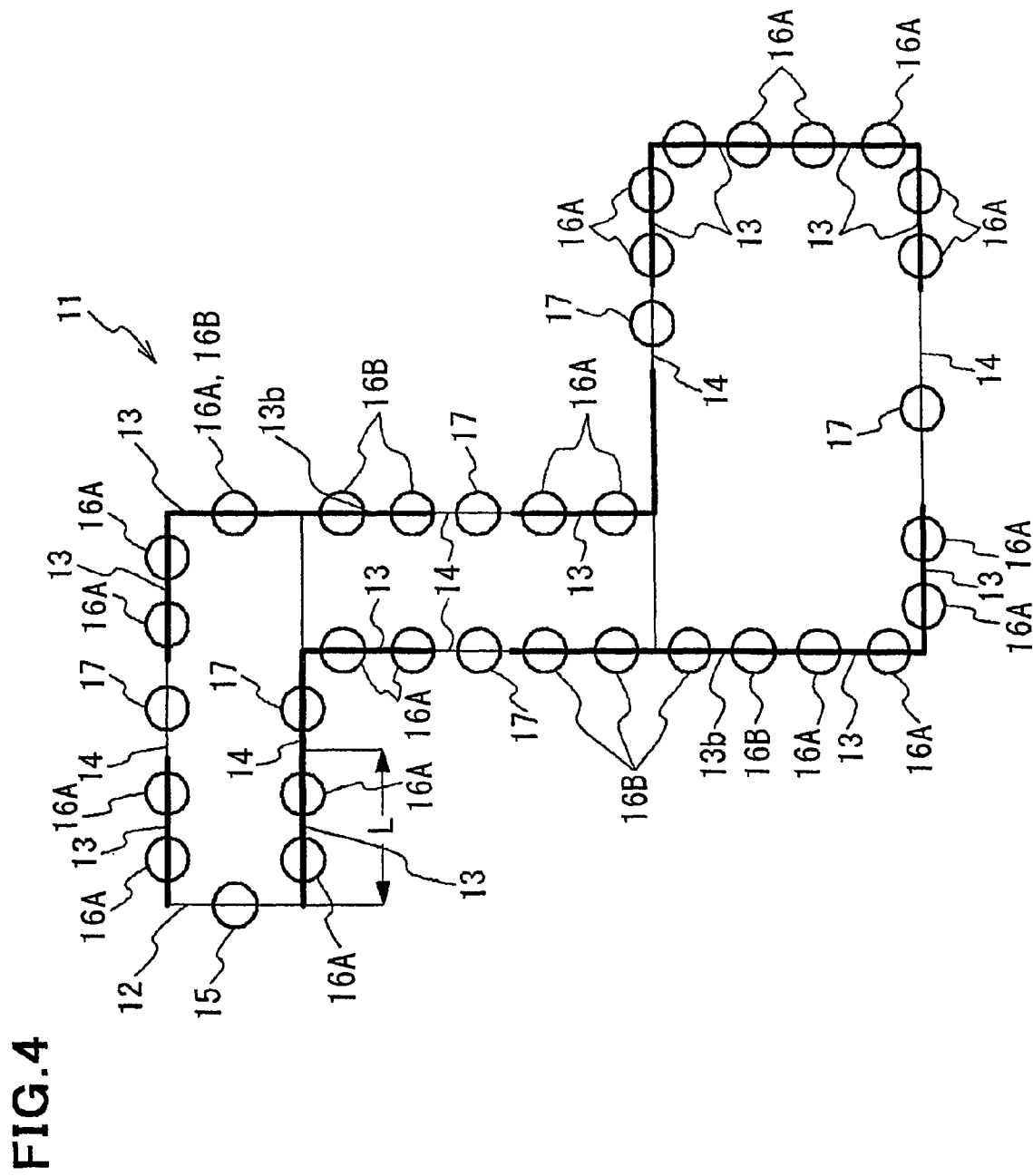
FIG. 4 is a plan view of a designed pattern on which sampling candidate points are selected.

Then, as illustrated in FIG. 4, sampling candidate points are selected on an edge of the designed pattern 11, in step S04. As mentioned later, some of the thus selected sampling candidate points are determined as sampling points at which a mask pattern is tested.

The sampling candidate points are selected differently in accordance with the portions 12, 13, 13b and 14 of an edge of the designed pattern 11.

As illustrated in FIG. 4, a sampling candidate point 15 is selected at a center of the end portion 12 in the end portion 12. In the corner portions 13, sampling candidate points 16A are selected on an edge of the designed pattern 11 at a predetermined interval starting from each of the corners of the designed pattern 11. The sampling candidate point 16A is not selected on an edge of the designed pattern 11 at the corners of the designed pattern 11. In the side portion 13b, sampling candidate points 16B are selected on an edge of the designed pattern 11 at a predetermined interval starting from the base points 18. In the remainder portion 14, sampling candidate points 17 are selected on an edge of the designed pattern 11 at a center thereof.

By selecting sampling candidate points in the above-mentioned manner, it is possible to select a lot of sampling candidate points in both the end portion 12 and the corner portions 13 both of which are much influenced by optical proximity effect.

Then, the designed pattern 11 is divided into a plurality of areas in step S05.

Figure 5:
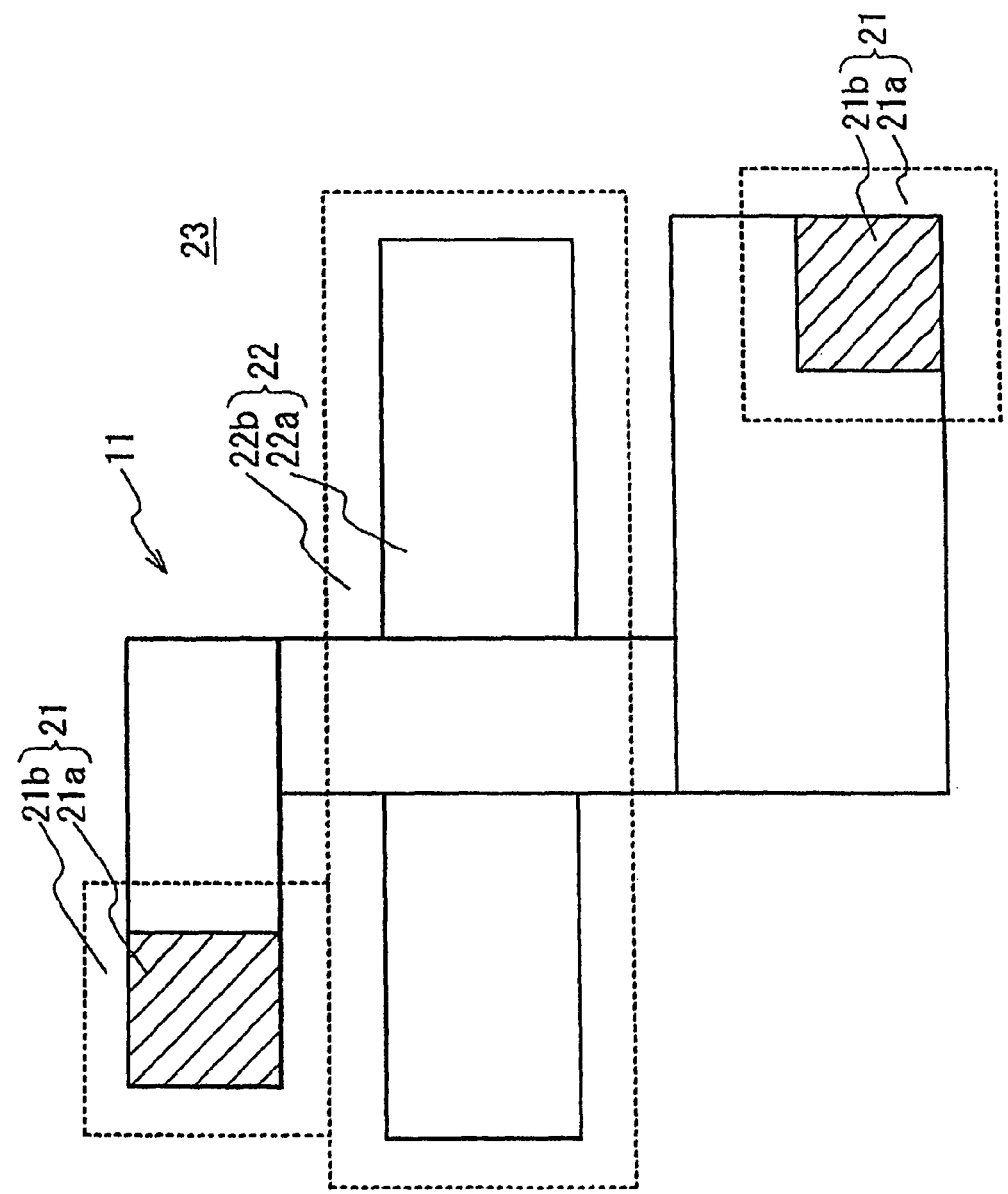
FIG. 5 is a plan view of a designed pattern divided into a plurality of areas.

As illustrated in FIG. 5, the designed pattern 11 is divided into contact areas 21, a field layer area 22 and a remainder area 23.

Each of the contact areas 21 is comprised of a projecting area 21a formed by projecting a contact reaching a gate wiring layer, onto the designed pattern 11, and an ambient area 21b surrounding the projecting area 21a and having a width, measured from an outer edge of the projecting area 21a, equal to or smaller than M1. The field layer area 22 is comprised of a projecting area 22a formed by projecting an active area of a MOS transistor onto the designed pattern 11, and an ambient area 22b surrounding the projecting area 22a and having a width, measured from an outer edge of the projecting area 22a, equal to or smaller than M2. The remainder area 23 is an area other than the contact areas 21 and the field area 22 in the designed pattern 11.

Then, sampling points are selected among the sampling candidate points, in step S06.

Figure 6:
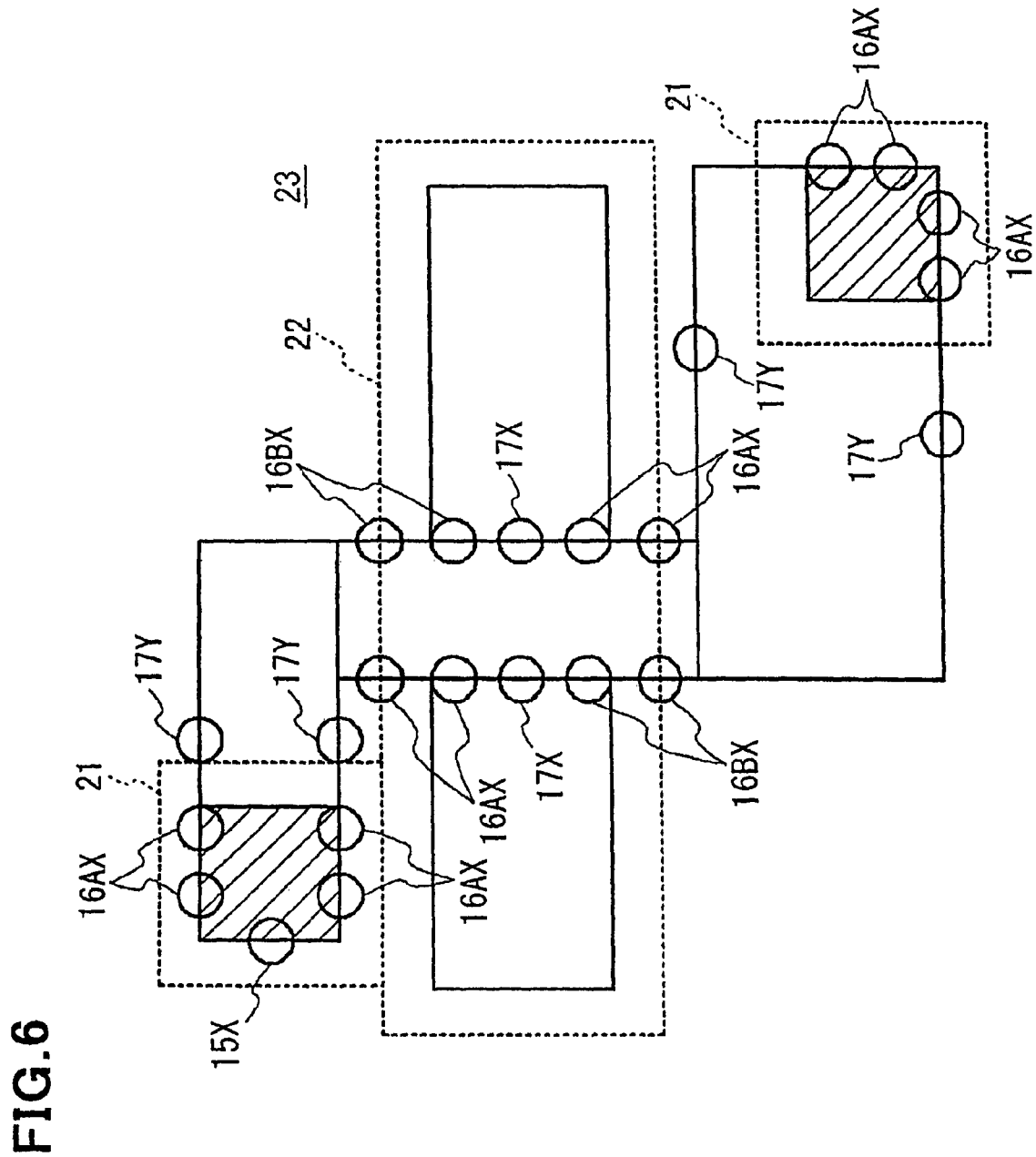
FIG. 6 is a plan view of a designed pattern on which sampling points are selected.

As illustrated in FIG. 6, a part of the sampling candidate points 15, 16A, 16B and 17 having been selected in the end portion 12, the corner portions 13, the side portions 13b and the remainder portion 14 in step S04, respectively, is selected as sampling points 15X, 16AX, 16BX and 17X.

The sampling points 15X, 16AX, 16BX and 17X are selected in different manners in accordance with the contact area 21, the field layer area 22 and the remainder area 23.

As illustrated in FIG. 6, all of the sampling candidate points 15, 16A, 16B and 17 having been selected in the contact area and the field layer area 22 are selected as the sampling points 15X, 16AX, 16BX and 17X. In contrast, in the remainder area 23, only the sampling candidate points 17 having been selected in the remainder portion 14 are selected as the sampling points 17Y.

By selecting the sampling points 15X, 16AX, 16BX, 17X and 17Y in the above-mentioned manner, it is possible to appropriately select the sampling points in accordance with a structure of a semiconductor integrated circuit as a final product. For instance, dimensions of an area in which a contact makes contact with a wiring formed in a gate wiring layer, and an area around the area (namely, the contact area 21) in the designed pattern 11 have to be accurately tested in order to ensure electrical connection in a semiconductor integrated circuit. Furthermore, in order to have a MOS transistor in a semiconductor integrated circuit accomplish desired performances, dimensions of a portion acting as a gate of a MOS transistor and an area around the portion (namely, the field layer area 22) in the designed pattern 11 have to be accurately tested. On the other hand, the rest of a gate wiring layer does not exert as much influence on behavior of a semiconductor integrated circuit, and hence, it is not necessary to accurately test the rest of a gate wiring layer.

In the present embodiment, since a relatively great number of the sampling points 15X, 16AX, 16BX and 17X is selected in the contact area 21 and the field layer area 22, dimensions in the contact area 21 and the field layer area 22 are accurately tested, whereas since a relatively small number of the sampling points 17Y is selected in the remainder area 23, dimensions in the remainder area 23 are not accurately tested.

Then, the mask pattern is tested at each of the sampling points 15X, 16AX, 16BX, 17X and 17Y, in step S07.

A resist pattern to be transferred to a resist when the resist is exposed to a light through a mask to which the mask pattern fabricated in step S02 is transferred is calculated by lithography simulation. The lithography simulation is carried out by the mask-pattern testing tool 4b.

Then, there is calculated a gap between dimensions of the designed pattern 11 (namely, a width of a pattern, a space between adjacent patterns and a location of an edge of the pattern) and dimensions of the resultant resist pattern. If a dimensional gap at a certain sampling point is without a test standard, the sampling point is judged as a sampling point having an error. All of the sampling points are tested as to whether they have an error, and then, the output device 6 outputs a report indicating which sampling points have an error.

Test standards used for testing the mask pattern in the areas 21, 22 and 23 are different from one another, and further, test standards used for testing the mask pattern in the portions 12, 13, 13b and 14 are different from one another. For instance, a test standard associated with the sampling points located in the contact area 21, a test standard associated with the sampling points located in the field layer area 22, and a test standard associated with the sampling points located in the remainder area 23 are different from one another. In addition, a test standard associated with the sampling points located in the end portion 12, a test standard associated with the sampling points located in the corner portions 13, and a test standard associated with the sampling points located in the remainder portion 14 are different from one another.

By determining test standards in accordance with the areas 21, 22 and 23, it would be possible to test a mask pattern with an appropriate test standard determined in accordance with a structure of a semiconductor integrated circuit as a final product. For instance, in the contact area 21 in which a contact or a via-hole is designed to make contact with a gate wiring layer, a location of an edge of a pattern of the gate wiring layer has to be accurately controlled in order to ensure that the contact makes contact with the gate wiring layer. Hence, there is determined a relatively severe test standard with respect to an edge of a pattern in the contact area 21. In contrast, a location of an edge of a pattern is not always necessary to be so accurately controlled in the remainder area 23 as the contact area 21. Accordingly, there is determined a relatively loose test standard with respect to an edge of a pattern in the remainder area 23, avoiding that an error is unnecessarily detected.

Furthermore, a test standard may be set loose for a sampling point closest to a corner even in the portion 12, 13, 13b or 14, since it is difficult to ensure high accuracy for such a sampling point, and a test standard may be set severe for other sampling points in the common portion. It would be possible to accurately test a mask pattern by preparing test standards different in accordance with the portions 12, 13, 13b and 14.

When an error is detected, a mask pattern is modified by changing conditions of the OPC tool 4a. The thus modified mask pattern is tested again.

When an error is not detected, the mask pattern is transferred to a mask. Thus, a mask is completely fabricated. A mask pattern is transferred to a mask in a conventional way.

In accordance with the above-mentioned embodiment, the designed pattern 11 to be tested is divided into a plurality of the areas 21, 22 and 23, and a test standard used for testing a mask pattern is determined for each of the areas 21, 22 and 23. Hence, a mask pattern is tested through the use a test standard appropriately determined in accordance with a structure of a semiconductor integrated circuit as a final product.

In addition, sampling points are selected in each of the areas 21, 22 and 23 in accordance with different processes from one another in association with the areas 21, 22 and 23. Hence, sampling points are selected at appropriate locations in accordance with a structure of a semiconductor integrated circuit as a final product, and it is ensured that a mask pattern is accurately tested with a minimum number of sampling points.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2003-094710 filed on Mar. 31, 2003 including specification, claims, drawings and summary is incorporated herein by reference in its entirety.

What is claimed is:

1. A method of using a computer device for testing a mask pattern, the method comprising the steps of:

(a) applying optical proximity-effect compensation to a first pattern to be tested and to be formed onto a mask layer, to thereby actually form a mask pattern of said mask layer;
(b) dividing said first pattern into a plurality of areas in accordance with a second pattern to be formed onto another mask layer;
(c) determining sampling points on an edge of said first pattern;
(d) determining a test standard for each of said areas;
(e) simulating with a computer device a resist pattern formed on a resist by exposing said resist to a light through said mask pattern; and
(f) checking whether a dimensional gap between said first pattern and said resist pattern at each of said sampling points is within a test standard associated with an area to which each of said sampling points belongs,
wherein a test standard for a first area among said areas and a test standard for a second area among said areas are different from each other, wherein the quantity of sampling points on the edge of said first pattern in the first area is different than the quantity of sampling points on the edge of said first pattern in the second area; and
wherein said compensated mask pattern of said mask layer is generated by changing a condition of the proximity-effect compensation when a difference between said mask design pattern to be tested and said resist pattern is out of the test standard,
wherein a process is ended when the difference between said mask design pattern to be tested and said resist pattern is within the test standard.

2. The method as set forth in claim 1, wherein a N-th sampling point located in a N-th area, among said sampling points, is determined in accordance with a N-th process in said step (c) wherein N indicates an integer equal to or greater than one (N=1, 2, 3, 4, - - - ), and first to N-th processes are different from one another.

3. The method as set forth in claim 1, further comprising:
dividing an edge of said first pattern into a plurality of portions, wherein said test standard is determined for each of said portions.

4. The method as set forth in claim 1, wherein said first pattern is a pattern for forming a wiring layer, said second pattern is a pattern for forming a contact reaching said wiring layer, and said first area includes a third area including a contact area in which said contact makes contact with said wiring layer.

5. The method as set forth in claim 4, wherein said third area is comprised of said contact area and an ambient area surrounding said contact area.

6. The method as set forth in claim 1, wherein said first pattern is a pattern for forming a wiring layer including a gate of a MOS transistor, said second pattern is a pattern for forming an active area of said MOS transistor, and said first area includes a fourth area including a fifth area obtained by projecting said active area onto said first pattern.

7. The method as set forth in claim 6, wherein said fourth area is comprised of said fifth area and an ambient area surrounding said fifth area.

8. The method as set forth in claim 1, wherein said mask layer to be tested is a gate layer, and a number of sampling points in an area acting as a gate of a transistor is higher than the same in other areas.

9. The method as set forth in claim 1, wherein said mask layer to be tested is a gate layer, and a number of sampling points in a contact area is higher than the same in other areas.

10. A non-transitory computer-readable medium storing a program for causing a computer to carry out a method of testing a mask pattern, wherein said method is executed by said computer in accordance with said program including the steps of:
(a) applying optical proximity-effect compensation to a first pattern to be tested and to be formed onto a mask layer, to thereby actually form a mask pattern of said mask layer;
(b) dividing said first pattern into a plurality of areas in accordance with a second pattern to be formed onto another mask layer;
(c) determining sampling points on an edge of said first pattern;
(d) determining a test standard for each of said areas;
(e) simulating a resist pattern formed on a resist by exposing said resist to a light through said mask pattern; and
(f) checking whether a dimensional gap between said first pattern and said resist pattern at each of said sampling points is within a test standard associated with an area to which each of said sampling points belongs,
wherein a test standard for a first area among said areas and a test standard for a second area among said areas are different from each other, wherein the quantity of sampling points on the edge of said first pattern in the first area is different than the quantity of sampling points on the edge of said first pattern in the second area; and
wherein said compensated mask pattern of said mask layer is generated by changing a condition of the proximity-effect compensation when a difference between said mask design pattern to be tested and said resist pattern is out of the test standard,
wherein a process is ended when the difference between said mask design pattern to be tested and said resist pattern is within the test standard.

11. The non-transitory computer-readable medium storing a program as set forth in claim 10, wherein a N-th sampling point located in a N-th area, among said sampling points, is determined in accordance with a N-th process in said step (c) wherein N indicates an integer equal to or greater than one (N=1, 2, 3, 4, - - - ), and first to N-th processes are different from one another.

12. The non-transitory computer-readable medium storing a program as set forth in claim 10, wherein said steps further include:
dividing an edge of said first pattern into a plurality of portions, wherein said test standard is determined for each of said portions.

13. The non-transitory computer-readable medium storing a program as set forth in claim 10, wherein said first pattern is a pattern for forming a wiring layer, said second pattern is a pattern for forming a contact reaching said wiring layer, and said first area includes a third area including a contact area in which said contact makes contact with said wiring layer.

14. The non-transitory computer-readable medium storing a program as set forth in claim 13, wherein said third area is comprised of said contact area and an ambient area surrounding said contact area.

15. The non-transitory computer-readable medium storing a program as set forth in claim 10, wherein said first pattern is a pattern for forming a wiring layer including a gate of a MOS transistor, said second pattern is a pattern for forming an active area of said MOS transistor, and said first area includes a fourth area including a fifth area obtained by projecting said active area onto said first pattern.

16. The non-transitory computer-readable medium storing a program as set forth in claim 15, wherein said fourth area is comprised of said fifth area and an ambient area surrounding said fifth area.

17. The non-transitory computer-readable medium storing a program as set forth in claim 10, wherein said mask layer to be tested is a gate layer, and a number of sampling points in an area acting as a gate of a transistor is higher than the same in other areas.

18. The non-transitory computer-readable medium storing a program as set forth in claim 10, wherein said mask layer to be tested is a gate layer, and a number of sampling points in a contact area is higher than the same in other areas.

19. A method of using a computer device for forming a mask having a desired mask pattern, the method including the steps of:
   (a) applying optical proximity-effect compensation to a first pattern to be tested and to be formed onto a mask layer, to thereby actually form a mask pattern of said mask layer;
   (b) dividing said first pattern into a plurality of areas in accordance with a second pattern to be formed onto another mask layer;
   (c) determining sampling points on an edge of said first pattern;
   (d) determining a test standard for each of said areas;
   (e) simulating with a computer device a resist pattern formed on a resist by exposing said resist to a light through said mask pattern;
   (f) checking whether a dimensional gap between said first pattern and said resist pattern at each of said sampling points is within a test standard associated with an area to which each of said sampling points belongs; and
   (g) transferring said mask pattern onto a mask,
   wherein a test standard for a first area among said areas and a test standard for a second area among said areas are different from each other, wherein the quantity of sampling points on the edge of said first pattern in the first area is different than the quantity of sampling points on the edge of said first pattern in the second area; and
   wherein said compensated mask pattern of said mask layer is generated by changing a condition of the proximity-effect compensation when a difference between said mask design pattern to be tested and said resist pattern is out of the test standard,
   wherein a process is ended when the difference between said mask design pattern to be tested and said resist pattern is within the test standard.

20. The method as set forth in claim 19, wherein a N-th sampling point located in a N-th area, among said sampling points, is determined in accordance with a N-th process in said step (c) wherein N indicates an integer equal to or greater than one (N=1, 2, 3, 4, - - - ), and first to N-th processes are different from one another.

21. The method as set forth in claim 19, further comprising: dividing an edge of said first pattern into a plurality of portions, wherein said test standard is determined for each of said portions.

22. The method as set forth in claim 19, wherein said first pattern is a pattern for forming a wiring layer, said second pattern is a pattern for forming a contact reaching said wiring layer, and said first area includes a third area including a contact area in which said contact makes contact with said wiring layer.

23. The method as set forth in claim 22, wherein said third area is comprised of said contact area and an ambient area surrounding said contact area.

24. The method as set forth in claim 19, wherein said first pattern is a pattern for forming a wiring layer including a gate of a MOS transistor, said second pattern is a pattern for forming an active area of said MOS transistor, and said first area includes a fourth area including a fifth area obtained by projecting said active area onto said first pattern.

25. The method as set forth in claim 19, wherein said mask layer to be tested is a gate layer, and a number of sampling points in an area acting as a gate of a transistor is higher than the same in other areas.

26. The method as set forth in claim 19, wherein said mask layer to be tested is a gate layer, and a number of sampling points in a contact area is higher than the same in other areas.

27. A computer device for testing a mask pattern performing the steps of:
   (a) applying optical proximity-effect compensation to a first pattern to be tested and to be formed onto a mask layer, to thereby actually form a mask pattern of said mask layer;
   (b) dividing said first pattern into a plurality of areas in accordance with a second pattern to be formed onto another mask layer;
   (c) determining sampling points on an edge of said first pattern;
   (d) determining a test standard for each of said areas;
   (e) simulating with a computer a resist pattern formed on a resist by exposing said resist to a light through said mask pattern; and
   (f) checking whether a dimensional gap between said first pattern and said resist pattern at each of said sampling points is within a test standard associated with an area to which each of said sampling points belongs,
   wherein a test standard for a first area among said areas and a test standard for a second area among said areas are different from each other, wherein the quantity of sampling points on the edge of said first pattern in the first area is different than the quantity of sampling points on the edge of said first pattern in the second area; and
   wherein said compensated mask pattern of said mask layer is generated by changing a condition of the proximity-effect compensation when a difference between said mask design pattern to be tested and said resist pattern is out of the test standard,
   wherein a process is ended when the difference between said mask design pattern to be tested and said resist pattern is within the test standard.

28. A computer device for forming a mask having a desired mask pattern, the computer device performing the steps of:
   (a) applying optical proximity-effect compensation to a first pattern to be tested and to be formed onto a mask layer, to thereby actually form a mask pattern of said mask layer;
   (b) dividing said first pattern into a plurality of areas in accordance with a second pattern to be formed onto another mask layer;
   (c) determining sampling points on an edge of said first pattern;
   (d) determining a test standard for each of said areas;
   (e) simulating with a computer a resist pattern formed on a resist by exposing said resist to a light through said mask pattern;
   (f) checking whether a dimensional gap between said first pattern and said resist pattern at each of said sampling points is within a test standard associated with an area to which each of said sampling points belongs; and
   (g) transferring said mask pattern onto a mask, wherein a test standard for a first area among said areas and a test standard for a second area among said areas are different from each other, wherein the quantity of sampling points on the edge of said first pattern in the first area is different than the quantity of sampling points on the edge of said first pattern in the second area; and wherein said compensated mask pattern of said mask layer is generated by changing a condition of the proximity-effect compensation when a difference between said mask design pattern to be tested and said resist pattern is out of the test standard, wherein a process is ended when the difference between said mask design pattern to be tested and said resist pattern is within the test standard.

* * * * *